United States Patent [19]

Kamakura

[11] Patent Number: 5,219,798
[45] Date of Patent: Jun. 15, 1993

[54] METHOD OF HEATING A SEMICONDUCTOR SUBSTRATE CAPABLE OF PREVENTING DEFECTS IN CRYSTAL FROM OCCURRING

[75] Inventor: Takanobu Kamakura, Yokosuka, Japan

[73] Assignee: Kabushiki Kaisha Toshiba, Kawasaki, Japan

[21] Appl. No.: 584,659

[22] Filed: Sep. 19, 1990

[30] Foreign Application Priority Data

Sep. 22, 1989 [JP] Japan .................. 1-247525

[51] Int. Cl.$^5$ .................. H01L 21/22; H01L 21/324
[52] U.S. Cl. .................. 437/248; 437/247; 148/DIG. 3; 156/DIG. 73
[58] Field of Search .............. 437/247, 248; 148/DIG. 3, DIG. 4; 156/603, DIG. 73

[56] References Cited

U.S. PATENT DOCUMENTS

| | | | |
|---|---|---|---|
| 3,194,700 | 7/1965 | Grimmeiss et al. | 437/248 |
| 3,627,590 | 12/1971 | Mammel | 437/248 |
| 4,135,027 | 1/1979 | Anthony et al. | 437/248 |
| 4,261,762 | 4/1981 | King | 437/248 |
| 4,576,652 | 3/1986 | Hovel et al. | 148/DIG. 4 |
| 4,888,302 | 12/1989 | Ramesh | 148/DIG. 4 |
| 5,061,444 | 10/1991 | Nazaroff et al. | 437/248 |

FOREIGN PATENT DOCUMENTS

| | | | |
|---|---|---|---|
| 0256949 | 5/1988 | Fed. Rep. of Germany | 437/248 |
| 0223112 | 11/1985 | Japan | 148/DIG. 3 |
| 0016509 | 1/1987 | Japan | 437/247 |
| 2137664 | 10/1984 | United Kingdom | 437/248 |

*Primary Examiner*—Mary Wilczewski
*Attorney, Agent, or Firm*—Finnegan, Henderson, Farabow, Garrett & Dunner

[57] ABSTRACT

In a method of heating a semiconductor substrate according to the present invention, a predetermined atmospheric gas such as $N_2$, $O_2$ and $H_2$, is sprayed onto the surface of an impurity layer formed by implanting ions into the main surface of the semiconductor substrate and, at the same time, the substrate is heated from a surface (interface of the impurity layer) opposite to the main surface, thereby annealing the substrate while keeping the temperature of the surface of the impurity layer lower than that of the interface. In this method, the temperature of the surface of the semiconductor substrate is made lower than that of the undersurface thereof so as to have a predetermined difference by the use of the cooling effect controlled by the flow rate of the atmospheric gas, and the semiconductor substrate is heated to have a gentle inclination of temperature in the substrate. It is thus possible to recover the crystallization of impurity layer from the interface of the impurity layer having perfect crystallization toward the surface thereof to eliminate defects in crystal occurring in the annealing operation for activation of impurity elements and recrystallization of the impurity layer.

2 Claims, 2 Drawing Sheets

METHOD OF HEATING A SEMICONDUCTOR SUBSTRATE CAPABLE OF PREVENTING DEFECTS IN CRYSTAL FROM OCCURRING

BACKGROUND OF THE INVENTION

1. Field of the Invention

The present invention relates to a method of heating a semiconductor integrated circuit device and, more particularly, to a method of heating a semiconductor substrate capable of preventing defects by implanting.

2. Description of the Related Art

Ion implantation for forming an impurity layer in a predetermined region is generally known as a technique of manufacturing a semiconductor integrated circuit. The ion implantation is a technique of accelerating an ionized element and implanting it into a semiconductor substrate and it is widely used as a method of implanting arsenic (As), antimony (Sb) or the like into a semiconductor substrate.

The ion implantation technique has not only various advantages but also disadvantage. When ions of high energy (10 KeV to several hundreds of KeV) serving as impurity elements are implanted into a semiconductor substrate, they collide with atoms constituting semiconductor crystal. Then, the ions which have the energy much higher than the atomic displacement energy in the crystal cause a number of defects in lattice in the crystal. The semiconductor substrate is thus heated to activate the impurity elements and recrystallize the impurity layer after the ions are implanted into the substrate.

As a well-known method of heating a semiconductor substrate, there is a hot zone method using an electric furnace anneal apparatus. In this apparatus, a jig for housing an ion-implanted semiconductor substrate is inserted into a high-temperature silica tube heated by resistance heating to heat the semiconductor substrate.

The semiconductor substrate inserted into the silica tube is entirely heated by the electric furnace anneal apparatus and its temperature is increased both on the surface on which an impurity layer is formed and on the undersurface opposite to the surface.

Crystal having defects in lattice or amorphous crystal is recrystallized not only in the direction from the interface (between the substrate and impurity layer) having complete crystallization to the surface but also in the direction from the surface to the interface. The defects in lattice are thus caused by grain growth or the like in the impurity layer in a region where the surfaces recrystallized from both the directions meet each other. If an amorphous region into which ions of high dose are implanted is heated, a great number of defects in lattice are generated in the recrystallized surface regions and the internal region of the impurity layer. And the defects in lattice cause severe defects in the crystal of an epitaxial layer grown onto an ion-implantation layer.

The anneal apparatus serves as a heating source for resistance heating. An RTA (Rapid Thermal Anneal) system wherein an infrared lamp serves as a heating source, has been considered and, in this system, a semiconductor substrate into which impurity elements are implanted is heated from the surface. Since, however, the substrate is heated from the surface (surface of ion-implantation layer), recrystallization progresses from the surface to cause defects in crystal near the interface of the ionimplantation layer.

If an active circuit element is formed on a semiconductor substrate having defects in lattice, the characteristic deterioration, such as a current leakage at a PN junction, and reduction in injection efficiency of electrons and holes, is caused.

SUMMARY OF THE INVENTION

It is accordingly an object of the present invention to provide a method of heating a semiconductor substrate in which defects in crystal are prevented by recrystallization from the interface to the surface of an impurity layer to eliminate the deterioration of characteristics such as withstanding voltage of a circuit element formed from the impurity layer and to improve the reliability of devices.

According to the present invention, there is provided a method of heating a semiconductor substrate comprising a second step of spraying a predetermined atmospheric gas onto the surface of an impurity layer which is formed by implanting impurities into a predetermined region of the main surface of the semiconductor substrate and, at the same time, heating the substrate from the interface of the impurity layer (undersurface of the semiconductor substrate) while keeping the temperature of the surface of the impurity layer lower than that of the interface thereof.

The above-described method according to the present invention enables recrystallization to progress from the interface to the surface of an impurity layer having perfect crystallization to prevent defects in crystal of the impurity layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
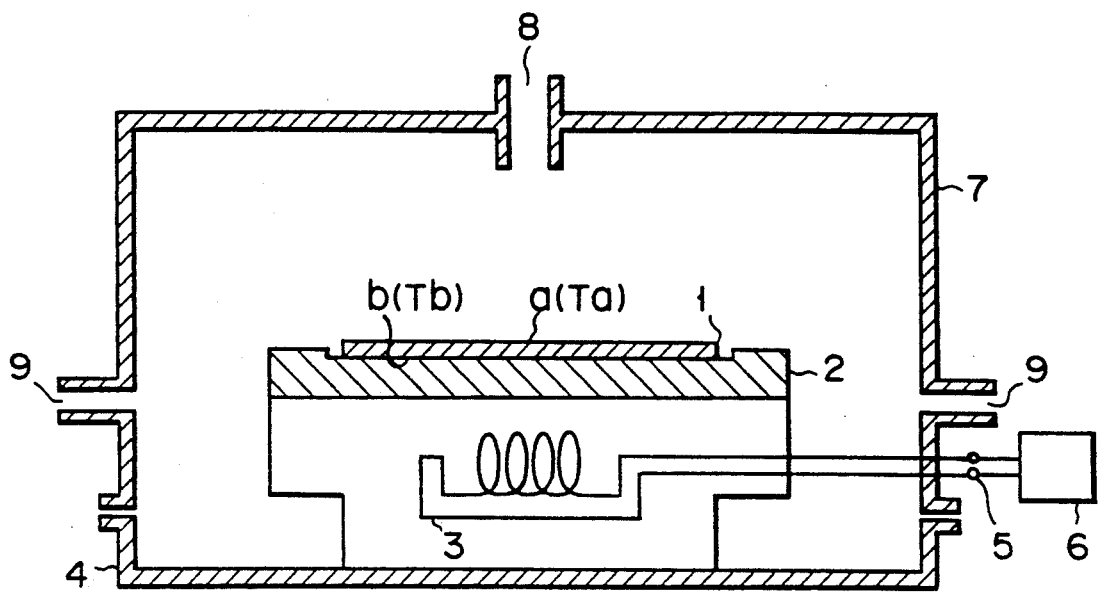
FIG. 1 is a view showing the structure of an apparatus to which a method of heating a semiconductor substrate according to the present invention can be applied.

FIG. 1 shows the structure of an apparatus to which a method of heating a semiconductor substrate according to the first embodiment of the present invention can be applied.

Referring to FIG. 1, semiconductor substrate 1 into which ions are implanted are placed on supporting table 2 capable of being heated at a high frequency and formed of a carbon suscepter coated with silicon carbide (SiC) with surface a (onto which impurities are diffused) of semiconductor substrate 1 upward.

Semiconductor substrate 1 is not only placed to improve in heat conduction but also can be adsorptively fixed onto supporting table 2.

Supporting member 2 is installed in body 4 in which high frequency induction heating coil 3 is housed. Coil 3 is supplied with high frequency current from high frequency power supply 6 through terminal 5. Bell jar 7 made of quartz glass is hermetically and detachably attached to body 4. Bell jar 7 includes supply port 8 and exhaust port 9 for atmospheric gas. Supply port 8 is so arranged that the atmospheric gas ($N_2$, $O_2$, $H_2$, etc.) can be uniformly sprayed onto surface a of semiconductor substrate 1 into which ions are implanted.

In the apparatus so arranged, semiconductor substrate 1 containing impurities is placed on supporting table 2 in body 4 at room temperature. Bell jar 7 is then closed, and high frequency current flows through coil 3 while supplying and exhausting a predetermined atmospheric gas under process conditions, thereby heat-ing supporting table 2.

Semiconductor substrate 1 is thus heated from undersurface b. Since atmospheric gas is sprayed onto surface a of semiconductor substrate 1 from supply port 8, as described above, a cooling effect of suppressing an increase in temperature of surface a is produced. The cooling effect causes difference t between temperature Ta of surface a of substrate 1 and temperature Tb of undersurface b thereof.

Figure 2:
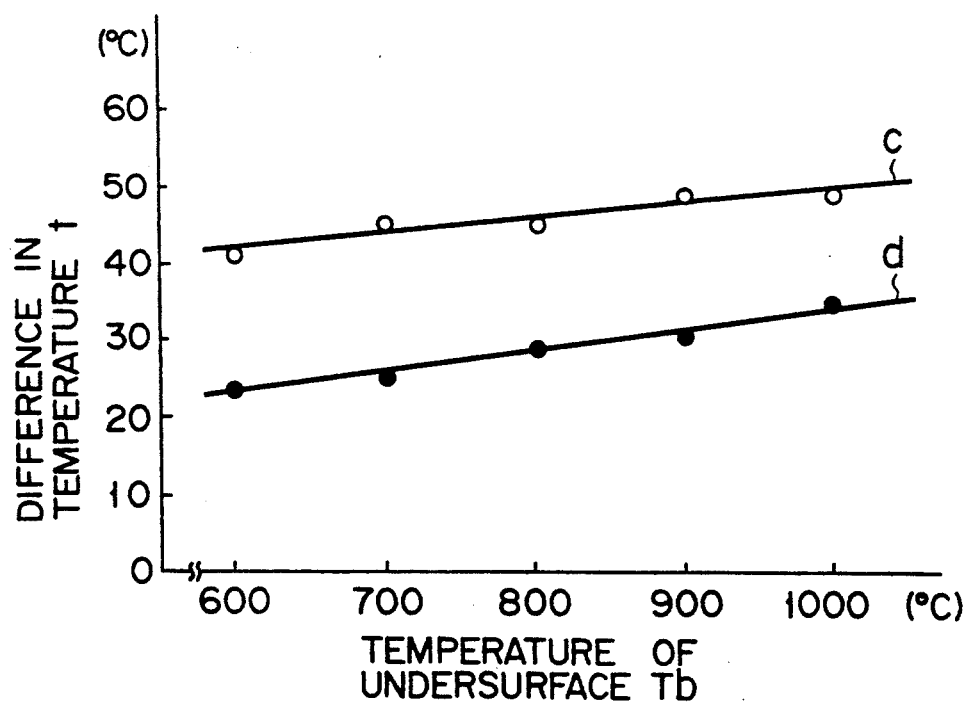
FIG. 2 is a graph showing the relationship between temperature Tb of the undersurface of the semiconductor substrate and temperature difference t between temperatures Ta and Tb of the surface and undersurface of the semiconductor substrate in order to explain the method of the present invention.

FIG. 2 is a graph showing the characteristics of temperature difference t between surface temperature Ta and undersurface Tb relying upon a difference in a flow rate of atmospheric gas. In FIG. 2, surface temperature Ta is represented by the axis of ordinates and undersurface temperature Tb is represented by the axis of abscissas. The conditions for measuring the temperatures are as follows. Nitrogen gas is used as the atmospheric gas and a flow rate of the gas is set to 50 l/min (solid line c in FIG. 2) and 150 l/min (solid line d in FIG. 2). When undersurface temperature Tb increases from 600° C. to 1000° C., surface temperature Ta is measured by a thermopile.

As undersurface temperature Tb increases, temperature difference t widens. Lines c and d representing temperature Tb and difference t extend almost linearly and have substantially the same inclination with the same interval therebetween substantially the same, regardless of undersurface temperature Tb.

According to the heating method of the present invention, a cooling effect is obtained by spraying atmospheric gas onto surface a of semiconductor substrate 1, and the cooling effect can be controlled by the flow rate of the atmospheric gas so that surface temperature Ta can be prevented from increasing.

Figure 3:
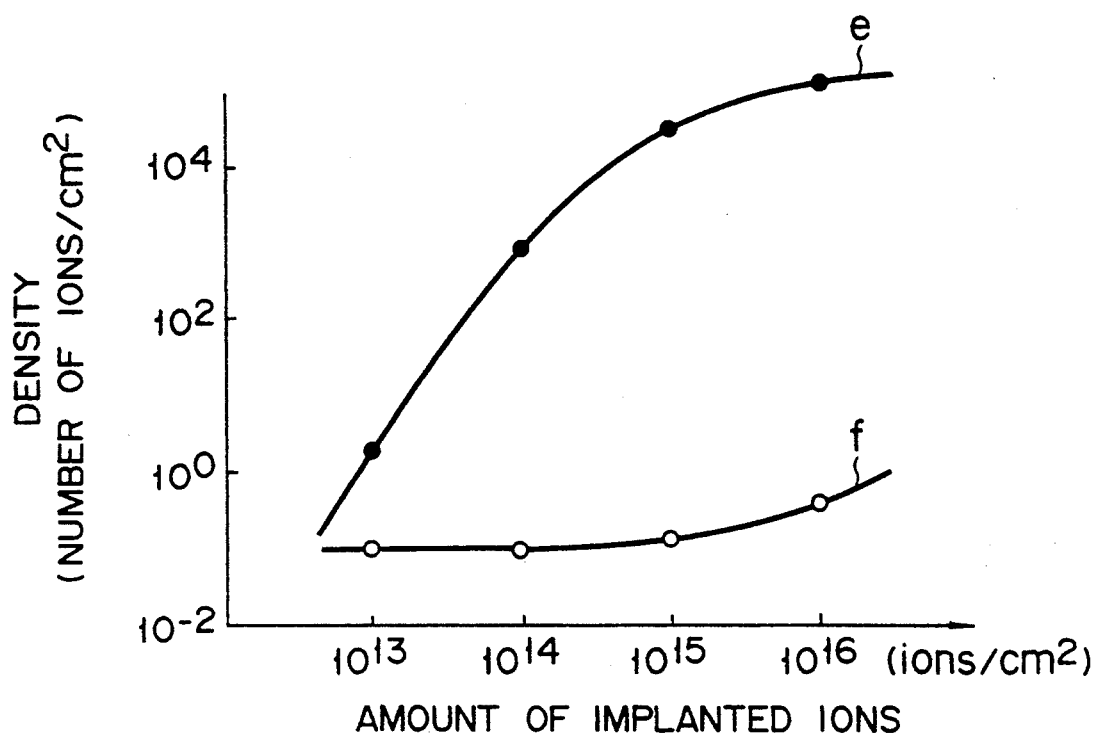
FIG. 3 is a graph showing the relationship between an amount of implanted ions and the density of defects in crystal in both the present invention and prior art.

FIG. 3 shows the relationship between an amount of ions implanted into a semiconductor substrate and the density of defects in crystal in the method of the present invention and the relationship between them in the prior art method.

In order to obtain the density, the flow rate of the atmospheric gas is set so that difference t between surface temperature Ta (temperature of the surface into which impurities are implanted) and undersurface temperature Tb of semiconductor substrate 1 becomes 30° C. After undersurface temperature Tb is increased up to 900° C. and the temperature is maintained for thirty minutes, semiconductor substrate 1 is cooled down to the room temperature and taken out of the body. To confirm defects in crystal of substrate 1, a silicon film of 2 μm is epitaxially grown on surface a of the substrate, and then the silicon film is removed by about 1 μm by selective etching. The defects in crystal appearing as etch pits are observed by a differential interference microscope.

According to the conventional heating method, semiconductor substrate 1 housed in a substrate housing is inserted into an anneal room of a quartz glass tube and heated up to 900° C. The temperature of 900° C. is maintained for thirty minutes, then the semiconductor substrate is cooled down to the room temperature and taken out of the housing. As is similar to the method of the present invention, the defects in crystal appearing as etch pits on the substrate are observed by the differential interference microscope.

As a result, the defects in crystal in the semiconductor substrate heated by the conventional method increase in proportion to the amount of implanted ions as indicated by line e in FIG. 3, and the number of defects in crystal in the semiconductor substrate heated by the method of the present invention is fixed and smaller than that of the defects caused by the conventional method, as shown by line f in FIG. 3, even though the amount of ions implanted into the substrate is increased.

With the preferred embodiments of the present invention, the defects in crystal appearing as etch pits is reduced and the number thereof is about $1/10^3$ that of defects caused by the conventional method, which is a remarkable effect of the present invention. Furthermore, it is confirmed that the level of the defects in crystal in the ion-implantation layer is restored to that of defects in crystal caused in a known semiconductor substrate (bulk wafer).

Figure 4:
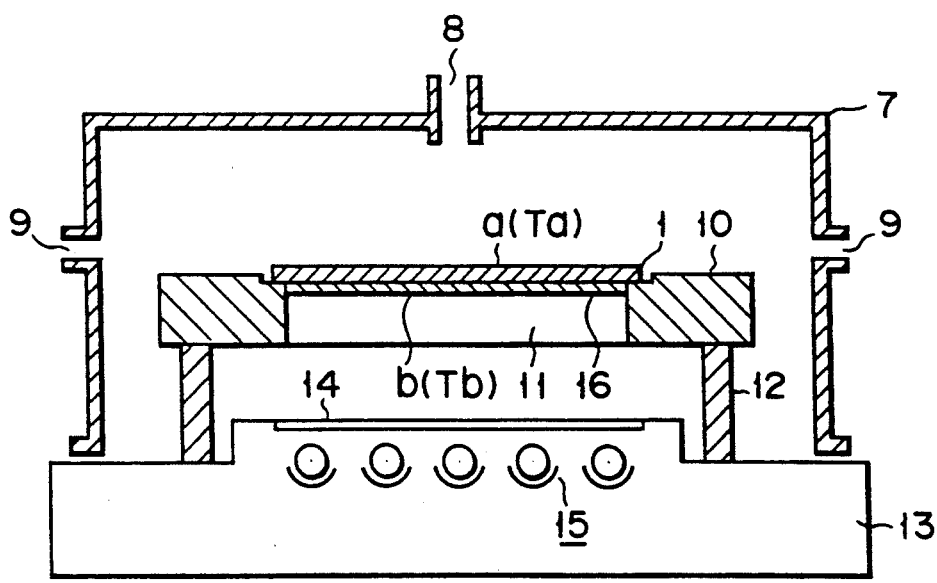
FIG. 4 is a view showing the structure of another apparatus to which the method of the present invention can also be applied.

FIG. 4 is a view showing the structure of a processing apparatus according to the second embodiment of the present invention in which in place of the high frequency induction heating coil 3 of the processing apparatus according to the first embodiment, serving as a heating source (see FIG. 1), a halogen lamp 15 is used as an infrared heating source. In FIG. 4, the descriptions of the elements denoted by the same numerals as those in FIG. 1 are omitted.

Supporting table 10 on which semiconductor substrate 1 is to be placed, is made of heatproof material. Supporting table 10 is formed like a ring and has hole 11 whose area is slightly smaller than that of semiconductor substrate 1. Semiconductor substrate 1 is placed so as to stop hole 11.

Supporting table 10 is fixed to base 13 by means of several supporting poles 12. An infrared heating source constituted of halogen lamp 15 is provided in base 13 to first heat undersurface b of semiconductor substrate 1 placed on supporting table through quartz glass 14. Bell jar 7 is detachably and hermetically mounted on base 13.

Bell jar 7 includes supply port 8 and exhaust port 9 for atmospheric gas. Supply port 8 is so arranged that the atmospheric gas ($N_2$, $O_2$, $H_2$, etc.) can be uniformly sprayed onto surface a of semiconductor substrate 1.

In the apparatus so arranged, semiconductor substrate 1 is placed on supporting table 2 at room temperature. Bell jar 7 is then closed, and undersurface b of semiconductor substrate 1 is irradiated by halogen lamp 15 while supplying and exhausting a predetermined atmospheric gas under process conditions, thereby heating semiconductor substrate 1. Like in the first embodiment, difference t between temperature Ta of surface a of substrate 1 and temperature Tb of undersurface b thereof is caused; accordingly the same effect as that of the first embodiment can be obtained.

Thermal dispersion plate 16 can be provided between semiconductor substrate 1 and supporting table 10 so that substrate 1 is uniformly heated.

If temperature difference t is 100° C. or more, defects in crystal, which is called slip, occur on the periphery of the semiconductor substrate. It is thus necessary to reduce temperature difference t below 100° C. when the process conditions are set.

As described above, in the heating method according to the preferred embodiments of the present invention, the temperature of the surface of semiconductor substrate 1 is made lower than that of the undersurface thereof by the use of the cooling effect which can be controlled by the flow rate of the atmospheric gas, and the temperature in the substrate gently varies from the surface to the undersurface of the ion-implantation layer. The recrystallization of an amorphous layer and a damage layer caused by ion implantation progresses from the undersurface to the surface of the ion-implantation layer having perfect crystallization. It is therefore possible to prevent defects in crystal of the ion-implantation layer from being caused by the recrystallization from the surface of the semiconductor substrate.

The effects of the present invention can be confirmed in the recrystallization of a layer into which ions are implanted at a relatively small dose of about $10^{14}$ cm$^2$ in a process for forming a base of a bipolar transistor. The present invention is effective in noise and most suitable for an integrated circuit device used in audio systems.

When an active circuit element is formed on semiconductor substrate 1 from which defects in crystal are eliminated, the characteristic deterioration such as generation of noise and reduction in electron-injection efficiency will be eliminated.

In the above embodiments of the present invention, the resistance heating source and lamp heating source are used as a heating source. Instead of these heating sources, an electronic beam heating source and a laser beam heating source can be applied to the heating method of the present invention.

In the heating apparatus of the above embodiment, a cooling effect can be obtained by spraying atmospheric gas onto surface a of semiconductor substrate 1 from gas supply port 6, and the cooling effect can be controlled by the flow rate of the atmospheric gas. The cooling effect can be controlled by a predetermined flow rate of the atmospheric gas after decreasing the temperature of the atmospheric gas itself or by a combination of the flow rate and the temperature of the atmospheric gas.

In the above embodiment, the semiconductor substrate is heated from its undersurface by a single heating source. However, a semiconductor substrate can be inserted between two or more heating sources whose surfaces are parallel to each other and which have different temperatures to heat the substrate so that the undersurface of the substrate is made higher than that of the surface thereof.

As described in detail, according to the heating method of the present invention, defects in crystal which occur in heating an impurity layer for activation of impurity elements and recrystallization, can be eliminated, and the characteristic deterioration of circuit elements to be formed can also be eliminated, thereby to improve the reliability of the semiconductor device.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of heating a semiconductor substrate comprising the steps of:

introducing impurities into a predetermined region of a main surface of the semiconductor substrate; and spraying a gas onto a surface of an impurity layer formed by the introducing step while heating the substrate from an interface of the impurity layer and keeping the temperature of the surface of the impurity layer lower than that of the interface, thereby progressing recrystallization from the interface to the surface of the impurity layer to prevent defects in crystal of the impurity layer, wherein the temperature of the surface of the impurity layer is decreased by varying the flow rate of the gas sprayed onto the surface.

2. A method of heating a semiconductor substrate comprising the steps of:

introducing impurities into a predetermined region of a main surface of the semiconductor substrate; and spraying a gas onto a surface of an impurity layer formed by the introducing step while heating the substrate from an interface of the impurity layer and keeping the temperature of the surface of the impurity layer lower than that of the interface, thereby progressing recrystallization from the interface to the surface of the impurity layer to prevent defects in crystal of the impurity layer, wherein the temperature of the surface of the impurity layer is decreased by varying the temperature of the gas having a predetermined flow rate sprayed onto the surface.

* * * * *